US009223652B2

(12) United States Patent
Cao et al.

(10) Patent No.: US 9,223,652 B2
(45) Date of Patent: *Dec. 29, 2015

(54) TRIPLE PARITY ENCODING TO FACILITATE DATA RECOVERY

(71) Applicant: EMPIRE TECHNOLOGY DEVELOPMENT LLC, Wilmington, DE (US)

(72) Inventors: Junwei Cao, Beijing (CN); Xiao Lin, Beijing (CN)

(73) Assignee: Empire Technology Development LLC, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/146,354

(22) Filed: Jan. 2, 2014

(65) Prior Publication Data

US 2014/0115426 A1    Apr. 24, 2014

Related U.S. Application Data

(63) Continuation of application No. 13/643,874, filed as application No. PCT/CN2011/081693 on Nov. 2, 2011, now Pat. No. 8,645,751.

(51) Int. Cl.
*G06F 11/00* (2006.01)
*G06F 11/10* (2006.01)
*H03M 13/29* (2006.01)

(52) U.S. Cl.
CPC ....... *G06F 11/1076* (2013.01); *H03M 13/2918* (2013.01); *H03M 13/2921* (2013.01); *G06F 2211/1057* (2013.01)

(58) Field of Classification Search
CPC ............ H03M 13/29; H03M 13/2918; H03M 13/2921; G06F 11/076
See application file for complete search history.

(56) References Cited

U.S. PATENT DOCUMENTS

| 6,792,391 | B1 | 9/2004 | Nanda |
| 6,993,701 | B2 | 1/2006 | Corbett et al. |
| 7,093,159 | B1 * | 8/2006 | Nanda .......................... 714/6.21 |
| 7,529,970 | B2 | 5/2009 | Hartline et al. |
| 7,613,984 | B2 | 11/2009 | Goel |
| 8,448,021 | B1 | 5/2013 | Bonwick |
| 8,516,342 | B2 | 8/2013 | Corbett et al. |
| 2003/0126523 | A1 | 7/2003 | Corbett et al. |
| 2005/0102470 | A1 | 5/2005 | Ishizaki |
| 2013/0124776 | A1 | 5/2013 | Hallak et al. |

FOREIGN PATENT DOCUMENTS

| CN | 1692335 A | 6/2005 |
| CN | 101512492 A | 8/2009 |
| EP | 1324200 A2 | 7/2003 |
| JP | 2009524124 A | 6/2009 |
| WO | 2007078803 A2 | 7/2007 |

OTHER PUBLICATIONS

Corbett et al.: "Row-diagonal parity for double disk failure correction," In Proceedings of the 3rd USENIX Conference on File and Storage Technologies, San Francisco, CA, Mar. 31, 2004, pp. 1-14, USENIX Association, Berkeley, CA, USA.
Huang et al.: "Star: An efficient coding scheme for correcting triple storage node failures," IEEE Transactions of Computers, vol. 57, No. 7, pp. 889-901, Jul. 2008.
Plank: "A tutorial on Reed-Solomon coding for fault-tolerance in RAID-like systems," Software: Practice and Experience, 1997, vol. 27, pp. 995-1012.
Leventhal: "Triple-Parity RAID and Beyond," Queue 7, 11 (Dec. 2009), pp. 30-39.
International Search report issued in application No. PCT/CN2011/081693 on Aug. 16, 2012.

* cited by examiner

*Primary Examiner* — Michael Maskulinski
(74) *Attorney, Agent, or Firm* — Brundidge & Stanger, P.C.

(57) ABSTRACT

Examples are disclosed for facilitating recovery from failures associated with a storage array having a plurality of storage devices.

20 Claims, 7 Drawing Sheets

Table 310

| Row # | 122-1 | 122-2 | 122-3 | 122-4 | 123 |
|---|---|---|---|---|---|
| 1 | 0 | 0 | 0 | 0 | 0 |
| 2 | 1 | 1 | 1 | 1 | 1 |
| 3 | 2 | 2 | 2 | 2 | 2 |
| 4 | 3 | 3 | 3 | 3 | 3 |
| 5 | 4 | 4 | 4 | 4 | 4 |
| 6 | 5 | 5 | 5 | 5 | 5 |
| 7 | 6 | 6 | 6 | 6 | 6 |
| 8 | 7 | 7 | 7 | 7 | 7 |
| 9 | 8 | 8 | 8 | 8 | 8 |
| 10 | 9 | 9 | 9 | 9 | 9 |
| 11 | 10 | 10 | 10 | 10 | 10 |
| 12 | 11 | 11 | 11 | 11 | 11 |
| 13 | 12 | 12 | 12 | 12 | 12 |
| 14 | 13 | 13 | 13 | 13 | 13 |
| 15 | 14 | 14 | 14 | 14 | 14 |
| 16 | 15 | 15 | 15 | 15 | 15 |

FIG. 3A

Table 320

| Row # | 122-1 | 122-2 | 122-3 | 122-4 | 123 | 124 |
|---|---|---|---|---|---|---|
| 1 | 0 | 1 | 2 | 3 |  | 0 |
| 2 | 1 | 2 | 3 |  | 0 | 1 |
| 3 | 2 | 3 |  | 0 | 1 | 2 |
| 4 | 3 |  | 0 | 1 | 2 | 3 |
| 5 | 4 | 5 | 6 | 7 |  | 4 |
| 6 | 5 | 6 | 7 |  | 4 | 5 |
| 7 | 6 | 7 |  | 4 | 5 | 6 |
| 8 | 7 |  | 4 | 5 | 6 | 7 |
| 9 | 8 | 9 | 10 | 11 |  | 8 |
| 10 | 9 | 10 | 11 |  | 8 | 9 |
| 11 | 10 | 11 |  | 8 | 9 | 10 |
| 12 | 11 |  | 8 | 9 | 10 | 11 |
| 13 | 12 | 13 | 14 | 15 |  | 12 |
| 14 | 13 | 14 | 15 |  | 12 | 13 |
| 15 | 14 | 15 |  | 12 | 13 | 14 |
| 16 | 15 |  | 12 | 13 | 14 | 15 |

FIG. 3B

Table 330

| Row # | 122-1 | 122-2 | 122-3 | 122-4 | 123 | 125 |
|---|---|---|---|---|---|---|
| 1 | 0 | 4 | 8 | 12 |  | 0 |
| 2 | 1 | 5 | 9 | 13 |  | 1 |
| 3 | 2 | 6 | 10 | 14 |  | 2 |
| 4 | 3 | 7 | 11 | 15 |  | 3 |
| 5 | 4 | 8 | 12 |  | 0 | 4 |
| 6 | 5 | 9 | 13 |  | 1 | 5 |
| 7 | 6 | 10 | 14 |  | 2 | 6 |
| 8 | 7 | 11 | 15 |  | 3 | 7 |
| 9 | 8 | 12 |  | 0 | 4 | 8 |
| 10 | 9 | 13 |  | 1 | 5 | 9 |
| 11 | 10 | 14 |  | 2 | 6 | 10 |
| 12 | 11 | 15 |  | 3 | 7 | 11 |
| 13 | 12 |  | 0 | 4 | 8 | 12 |
| 14 | 13 |  | 1 | 5 | 9 | 13 |
| 15 | 14 |  | 2 | 6 | 10 | 14 |
| 16 | 15 |  | 3 | 7 | 11 | 15 |

FIG. 3C

Table 340

| Row # | 122-1 | 122-2 | 122-3 | 122-4 | 126 |
|---|---|---|---|---|---|
| 1 | 0 | 5 | 10 | 15 | 0 |
| 2 | 1 | 6 | 11 |  | 1 |
| 3 | 2 | 7 |  | 12 | 2 |
| 4 | 3 |  | 8 | 13 | 3 |
| 5 | 4 | 9 | 14 |  | 4 |
| 6 | 5 | 10 | 15 |  | 5 |
| 7 | 6 | 11 |  |  | 6 |
| 8 | 7 |  | 12 |  | 7 |
| 9 | 8 | 13 |  | 3 | 8 |
| 10 | 9 | 14 |  |  | 9 |
| 11 | 10 | 15 |  | 0 | 10 |
| 12 | 11 |  |  | 1 | 11 |
| 13 | 12 |  | 2 | 7 | 12 |
| 14 | 13 |  | 3 |  | 13 |
| 15 | 14 |  |  | 4 | 14 |
| 16 | 15 |  | 0 | 5 | 15 |

FIG. 3D

500 A computer program product.

502 A signal bearing medium.

504 instructions to facilitate recovery from failures associated with a storage array having a plurality of storage devices that includes a plurality of data storage devices, a first row parity storage device, a second row parity storage device, a first diagonal parity storage device and a second diagonal parity storage device, which, when executed by logic, cause the logic to:

determine first row parities for the plurality of data storage devices, the first row parities spanning the plurality of data storage devices and being stored on the first row parity storage device;

determine first diagonal parities along first diagonal parity sets, the first diagonal parities spanning all except for one of the plurality of data storage devices and the first row parity storage device, the determined first diagonal parities being stored on the first diagonal parity storage device;

determine second diagonal parities along second diagonal parity sets, the second diagonal parities spanning all except for one of the plurality of data storage devices and the first row parity storage device, the determined second diagonal parities being stored on the second diagonal parity storage device; or determine second row parities for the plurality of data storage devices, the second row parities spanning the plurality of data storage devices and being stored on the second row parity storage device, wherein at least a portion of one or more rows of the second row parities includes determined second row parities based on a portion of the plurality of data storage devices.

| 506 a computer-readable medium. | 508 a recordable medium. | 510 a communications medium. |

FIG. 5

TRIPLE PARITY ENCODING TO FACILITATE DATA RECOVERY

CROSS-REFERENCE TO RELATED APPLICATION

The present application is a continuation application of U.S. patent application Ser. No. 13/643,874, filed Oct. 26, 2012, now U.S. Pat. No. 8,645,751, issued on Feb. 4, 2014, which is the National Stage filing under 35 U.S.C. §371 of PCT Application Ser. No. PCT/CN2011/081693 filed on Nov. 2, 2011, the entire disclosures of which are hereby incorporated by reference.

BACKGROUND

Unless otherwise indicated herein, the approaches described in this section are not prior art to the claims in this application and are not admitted to be prior art by inclusion in this section. Storage systems for storing or maintaining data may include various data storage devices such as hard disk drives (HHDs), solid state drives (SSDs) or direct access storage devices (DASDs). These storage systems may be implemented according to one or more types of storage architectures that may include a storage area network-attached storage environment, a storage area network or a disk assembly directly attached to a client or host computer. In some examples, data can be lost when one or more data storage devices fail or a portion of data stored on the one or storage devices becomes corrupted (e.g., checksum or media read errors). In order to avoid the loss of data, one or more schemes may be implemented in a storage system. These one or more schemes may include mirroring, backup or parity protection.

SUMMARY

The present disclosure describes some example methods for facilitating recovery from failures associated with a storage array. The storage array may have a plurality of storage devices. The plurality of storage devices may include a plurality of data storage devices, a first row parity storage device, a second row parity storage device, a first diagonal parity storage device and a second diagonal parity storage device. These example methods may include determining first row parities for the plurality of data storage devices. The first row parities may span the plurality of data storage devices and may be stored on the first row parity storage device. First diagonal parities along first diagonal parity sets may then be determined. The first diagonal parities may span all except for one of the plurality of data storage devices and the first row parity storage device and may be stored on the first diagonal parity storage device. The example methods may also include determining second diagonal parities along second diagonal parity sets. The second diagonal parities may span all except for one of the plurality of data storage devices and the first row parity storage device and may be stored on the second diagonal parity storage device. Second row parities for the plurality of data storage devices may then be determined. The second row parities may span the plurality of data storage devices and may be stored on the second row parity storage device. In some examples, at least a portion of one or more rows of the second row parities may include determined second row parities based on a portion of the plurality of data storage devices.

The present disclosure also describes example devices to facilitate recovery from failures associated with a storage array. The storage array may have a plurality of storage devices. The plurality of storage devices may include a plurality of data storage devices, a first row parity storage device, a second row parity storage device, a first diagonal parity storage device and a second diagonal parity storage device. These example devices may include a recovery manager having logic. The logic may be configured to determine first row parities for the plurality of data storage devices. The first row parities may span the plurality of data storage devices and may be stored on the first row parity storage device. The logic may also be configured to determine a first diagonal parity along first diagonal parity sets. The first diagonal parities may span all except for one of the plurality of data storage devices and the first row parity storage device and may be stored on the first diagonal parity storage device. The logic may also be configured to determine second diagonal parities along second diagonal parity sets. The second diagonal parities may span all except for one of the plurality of data storage devices and the first row parity storage device and may be stored on the second diagonal parity storage device. The logic may also be configured to determine second row parities for the plurality of data storage devices. The second row parities may span the plurality of data storage devices and may be stored on the second row parity storage device. In some examples, at least a portion of one or more rows of the second row parities may include determined second row parities based on a portion of the plurality of data storage devices.

The present disclosure also describes example systems to facilitate recovery from failures associated with a storage array. These example systems may have a plurality of storage devices. The plurality of storage devices may include a plurality of data storage devices, a first row parity storage device, a second row parity storage device, a first diagonal parity storage device and a second diagonal parity storage device. The example systems may also include a recovery manager having logic. The logic may be configured to determine first row parities for the plurality of data storage devices. The first row parities may span the plurality of data storage devices and may be stored on the first row parity storage device. The logic may also be configured to determine first diagonal parities along first diagonal parity sets. The first diagonal parity may span all except for one of the plurality of data storage devices and the first row parity storage device and may be stored on the first diagonal parity storage device. The logic may also be configured to determine second diagonal parities along second diagonal parity sets. The second diagonal parities may span all except for one of the plurality of data storage devices and the first row parity storage device and may be stored on the second diagonal parity storage device. The logic may also be configured to determine second row parities for the plurality of data storage devices. The second row parities may span the plurality of data storage devices and may be stored on the second row parity storage device. In some examples, at least a portion of one or more rows of the second row parities may include determined second row parities based on a portion of the plurality of data storage devices.

The present disclosure also describes example computer program products. In some examples, the computer program products may include a non-transitory medium having instructions to facilitate recovery from failures associated with a storage array having a plurality of storage devices. The plurality of storage devices may include a plurality of data storage devices, a first row parity storage device, a second row parity storage device, a first diagonal parity storage device and a second diagonal parity storage device. The instructions, which, when executed by logic, may cause the logic to determine first row parities for the plurality of data storage devices. The first row parities may span the plurality of data storage devices and may be stored on the first row parity storage device. The instructions may also cause the logic to determine first diagonal parities along first diagonal parity sets. The first diagonal parities may span all except for one of the plurality of data storage devices and the first row parity storage device and may be stored on the first diagonal parity storage device. The instructions may also cause the logic to determine second diagonal parities along second diagonal parity sets. The second diagonal parities may span all except for one of the plurality of data storage devices and the first row parity storage device and may be stored on the second diagonal parity storage device. The instructions may also cause the logic to determine second row parities for the plurality of data storage devices. The second row parities may span the plurality of data storage devices and may be stored on the second row parity storage device. In some examples, at least a portion of one or more rows of the second row parities may include a determined second row parity based on a portion of the plurality of data storage devices.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 3A-D illustrates example parity tables associated with triple parity encoding for a storage array;

FIG. 5 illustrates a block diagram of an example computer program product.

DETAILED DESCRIPTION

Figure 1:
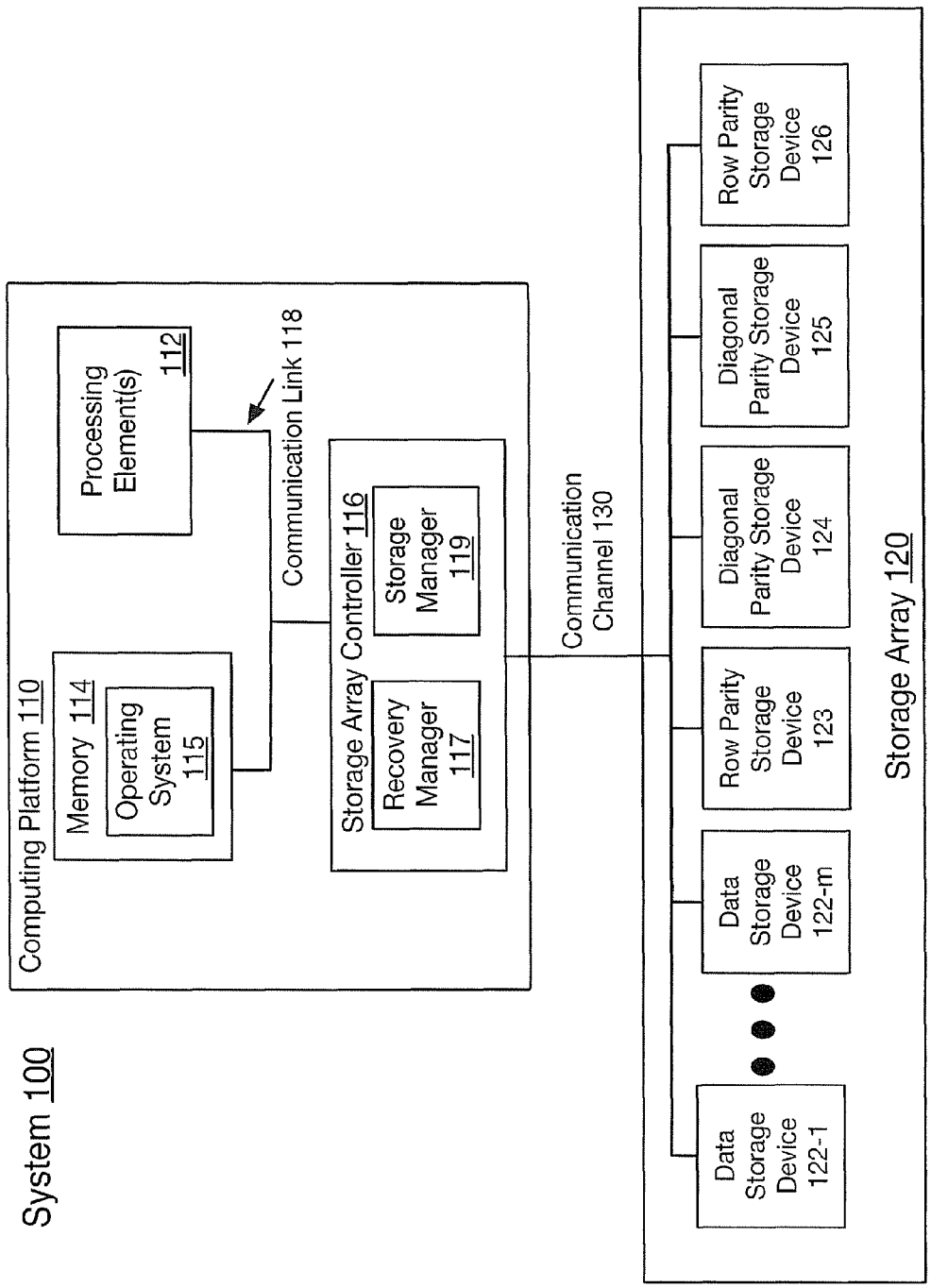
FIG. 1 illustrates an example system to facilitate recovery from failures associated with a storage array.

In the following detailed description, reference is made to the accompanying drawings, which form a part hereof. In the drawings, similar symbols typically identify similar components, unless context dictates otherwise. The illustrative examples or embodiments described in the detailed description, drawings, and claims are not meant to be limiting. Other examples or embodiments may be utilized, and other changes may be made, without departing from the spirit or scope of the subject matter presented here. It will be readily understood that aspects of this disclosure, as generally described herein, and illustrated in the Figures, can be arranged, substituted, combined, and designed in a wide variety of different configurations, all of which are explicitly contemplated and make part of this disclosure.

This disclosure is drawn, inter alia, to methods, apparatus, systems and computer program products related to facilitating recovery from failures associated with a storage array having a plurality of storage devices.

As contemplated in the present disclosure, one or more schemes may be implemented in a storage system to prevent loss of data should a storage device fail or a portion of data or information stored on the one or storage devices becomes corrupted. Also, as contemplated in the present disclosure, these one or more schemes may include mirroring, backup or parity protection. Mirroring may be an expensive solution in terms of resources needed to mirror data and backup may not protect data modified between backups.

In some examples, parity protection may be a preferred alternative to mirroring or backups. One type of parity protection typically referred to as single parity may provide redundant encoding of data that allows for recovery of lost data from a single storage device failure or corrupt data on a single storage device. Another type of parity protection typically referred to as double parity may provide redundant encoding of data that allows for recovery of lost data in a storage system having two storage devices failures, corrupt data on two storage devices or a combination of a storage device failure and corrupt data on a storage device. However, some storage systems may include large numbers of storage devices and the larger the system, the greater the probability of three storage device failures or corrupt data on three storage devices. Thus, a need exists for parity protection that allows for recovery of lost data in a storage system having three storage device failures, corrupt data on three storage devices or a combination of storage device failures and corrupt data on storage devices.

In some examples, recovery from failures associated with a storage array may be facilitated by a triple parity encoding scheme. For these examples, the storage array may have a plurality of storage devices. The plurality of storage devices may include a plurality of data storage devices and plurality of parity storage devices. These parity storage devices may include a first row parity storage device, a second row parity storage device, a first diagonal parity storage device and a second diagonal parity storage device. For these examples, first row parities for the plurality of data storage devices may be determined. The first row parities may span the plurality of data storage devices and may be stored on the first row parity storage device. First diagonal parities along first diagonal parity sets may then be determined. The first diagonal parities may span all except for one of the plurality of data storage devices and the first row parity storage device and may be stored on the first diagonal parity storage device. Second diagonal parities along second diagonal parity sets may also be determined. The second diagonal parities may span all except for one of the plurality of data storage devices and the first row parity storage device and may be stored on the second diagonal parity storage device. Second row parities for the plurality of data storage devices may then be determined. The second row parities may span the plurality of data storage devices and may be stored on the second row parity storage device. For these examples, at least a portion of one or more rows of the second row parities may include determined second row parities based on a portion of the plurality of data storage devices.

FIG. 1 illustrates an example system to facilitate recovery from failures associated with a storage array. As shown in FIG. 1, system 100 includes a computing platform 110 coupled to a storage array 120 via communication channel 130. Also, as shown in FIG. 1, computing platform 110 includes a processing element(s) 112, a memory 114 and a storage array controller 116. In some examples, as depicted in FIG. 1, processing element(s) 112, system memory 114 and storage array controller 116 may communicatively couple via a communication link 118.

In some examples, as shown in FIG. 1, storage array controller 116 may include a recovery manager 117 and a storage manager 119. System memory 114 is also shown in FIG. 1 as including an operating system 115. For some examples, operating system 115 may be maintained in memory 114 and may be configured to be executed by processing element(s) 112. Also, operating system 115 may work in cooperation with storage manager 119 to read from and write to storage array 120.

Also as shown in FIG. 1, storage array 120 may include data storage devices 122-1 to 122-m, where m represents any positive integer greater than 1. Storage array 120 may also include four parity storage devices shown in FIG. 1 as row parity storage device 123, diagonal parity storage device 124, diagonal parity storage device 125 and row parity storage device 126. The plurality of storage devices of storage array 120, as shown in FIG. 1, may be interconnected and communicatively coupled to storage array controller 116 via communication channel 130.

According to some examples, storage array controller 116 may cooperate with storage array 120 to access information or data requested by a user (or client). The data may be stored on any type of attached storage device such as video tape, optical, digital versatile disks (DVDs), magnetic tape, bubble memory, electronic random access memory, micro-electro mechanical or any other similar storage media configured to store data or parity information. Although not shown in FIG. 1, storage array controller 116 and storage array 120 may separately include interface circuitry to communicatively couple computing platform 110 to storage array 120 via communication channel 130. For these examples, communication channel 130 may operate according to various communication protocols to include, but not limited to, Universal Serial Bus (USB), PCI-Express, Serial Advanced Technology Attachment (SATA), Parallel Advanced Technology Attachment (PATA) or small computer system interface (SCSI).

In some examples, as described more below, recovery manager 117 may include logic and/or features to facilitate recovery from failures associated with storage array 120. The failures may include a complete failure of one or more storage devices from storage array 120 and/or corrupt data or information (e.g., checksum error) on one or more storage devices from storage array 120. For these examples, recovery manager 117 may implement a triple parity encoding scheme that uses the four parity storage devices of storage array 120.

According to some examples, when implementing the triple parity encoding scheme, storage array 120 may include n data storage devices and four parity storage devices, where n=p−1 and p is a prime number greater than 3. For these examples, each of the plurality of storage devices of storage array 120 may be divided by recovery manager 117 into chunks. Each of the plurality of storage devices may then be further organized by recovery manager 117 into stripes that include a same number of chunks in each storage device. Also, each of the plurality of storage devices may be striped into $(p-1)^2$ chunks. In some examples, the plurality of storage devices may be striped according to a Redundant Array of Independent Disks (RAID) scheme (e.g., RAID 6), although this disclosure is not limited to only a RAID striping scheme.

Figure 2:
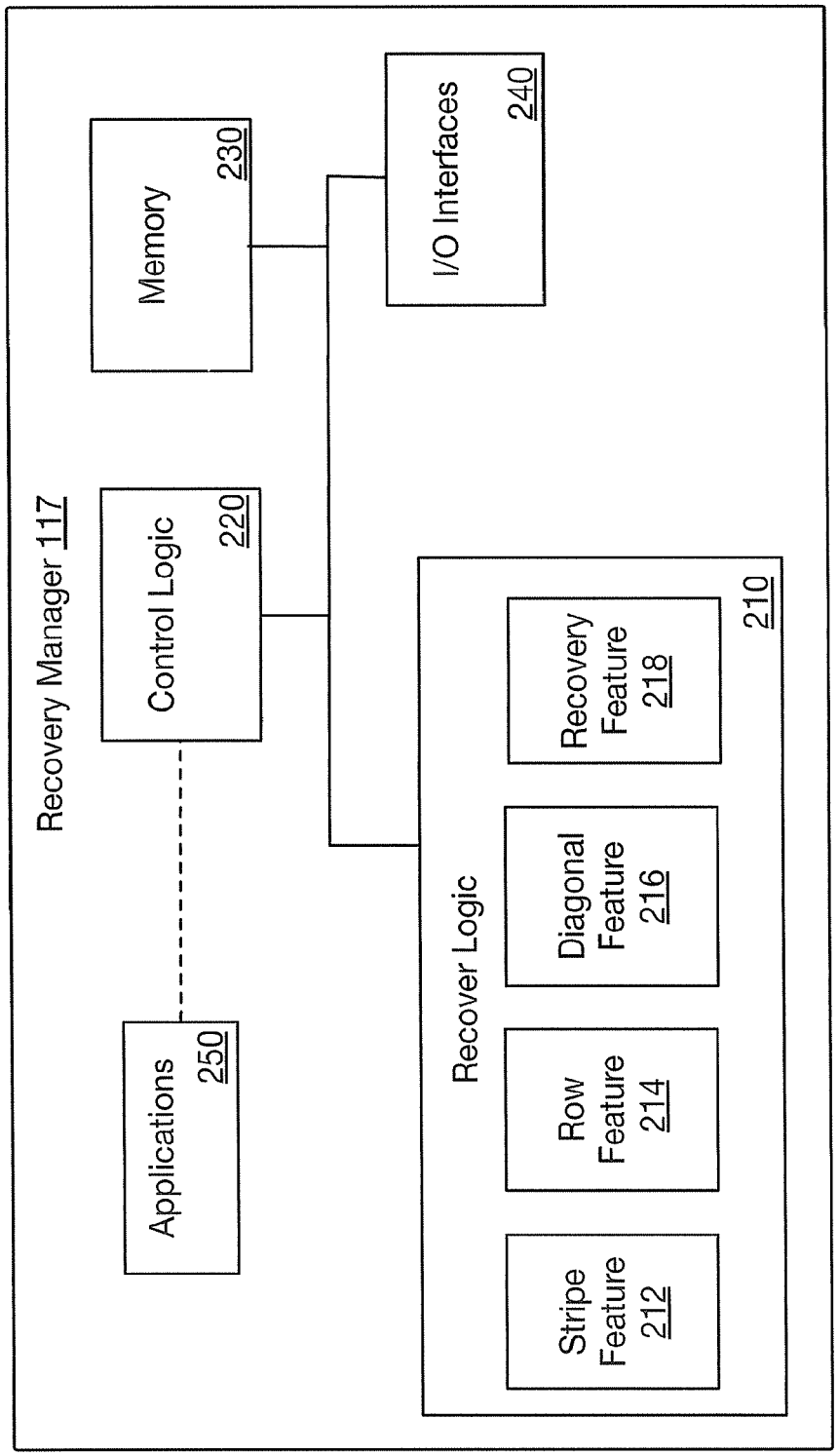
FIG. 2 illustrates a block diagram of an example architecture for a recovery manager.

FIG. 2 illustrates a block diagram of an example architecture for a recovery manager. As described above for system 100 in FIG. 1, storage array controller 116 includes recovery manager 117. In some examples, recovery manager 117 includes features and/or logic configured or arranged to facilitate recovery from failures associated with a storage array such as storage array 120.

The example recovery manager 117 of FIG. 2 includes recover logic 210, control logic 220, memory 230 and input/output (I/O) interfaces 240. As illustrated in FIG. 2, recover logic 210 is coupled to control logic 220, memory 230 and I/O interfaces 240. Recover logic 210 may further include one or more of a stripe feature 212, a row feature 214, a diagonal feature 216, or a recovery feature 218, or any reasonable combination thereof.

In some examples, the elements portrayed in FIG. 2's block diagram are configured to support or enable recovery manager 117 as described in this disclosure. A given recovery manager 117 may include some, all or more elements than those depicted in FIG. 2. For example, recover logic 210 and control logic 220 may separately or collectively represent a wide variety of logic device(s) to implement the features of recovery manager 117. An example logic device may include one or more of a computer, a microprocessor, a microcontroller, a field programmable gate array (FPGA), an application specific integrated circuit (ASIC), a sequestered thread or a core of a multi-core/multi-threaded microprocessor or a combination thereof.

In some examples, as shown in FIG. 2, recover logic 210 includes stripe feature 212, row feature 214, diagonal feature 216, or recovery feature 218. Recover logic 210 may be configured to use one or more of these features to perform operations. As described in more detail below, example operations may include organizing storage devices into stripes according to a striping scheme. Example operations may also include determining row and diagonal parity sets to be stored according to the striping scheme and facilitating a recovery from failures associated with a storage array (e.g., storage array 120) using the determined row and diagonal parity sets.

In some examples, control logic 220 may be configured to control the overall operation of recovery manager 117. As mentioned above, control logic 220 may represent any of a wide variety of logic device(s) configured to operate in conjunction with executable content or instructions to implement the control of recovery manager 117. In some alternate examples, the features and functionality of control logic 220 may be implemented within recover logic 210.

According to some examples, memory 230 is arranged to store executable content or instructions. The executable content or instructions may be used by control logic 220 and/or recover logic 210 to implement or activate features or elements of recovery manager 117. Memory 230 may also be arranged to at least temporarily maintain information associated with determining row or diagonal parities (e.g., construction algorithms) and storing the row or diagonal parities according to a striping scheme.

Memory 230 may include a wide variety of memory media including, but not limited to, one or more of volatile memory, non-volatile memory, flash memory, programmable variables or states, random access memory (RAM), read-only memory (ROM), or other static or dynamic storage media.

In some examples, I/O interfaces 240 may provide an interface between recovery manager 117 and elements or devices that may be communicatively coupled to storage array controller 116. For example, as mentioned above for FIG. 1, storage array controller 116 may be configured to communicatively couple to processing element(s) 112 or memory 114 via communication link 118 or may be configured to communicatively couple to storage array 120 via communication channel 130. The I/O interfaces 240, for example, may include an interface configured to operate according to various wireless and/or wired communication protocols to allow recovery manager 117 to communicate over communication link 118 or communication channel 130 (e.g., Inter-Integrated Circuit (I²C), System Management Bus (SMBus), Serial Peripheral Interface Bus (SPI) USB, SATA, PATA, SCSI, eSATA, PCI-Express, IEEE 802.1, IEEE 802.11, IEEE 802.16, GSM, GPRS, EDGE, W-CDMA, HSPA, LTE, CDMA-2000, EV-DO, etc.).

FIGS. 3A-D illustrate example parity tables associated with triple parity encoding for a storage array. In some examples, the storage array may be similar to storage array 120 as shown in FIG. 1. As shown in FIGS. 3A-D, table 310, table 320, table 330 and table 340 may be constructed based, at least in part, on the use of four parity storage devices. These parity tables provide an example of a triple parity encoding scheme. This triple parity encoding scheme may facilitate recovery from failures associated with up to three failures (complete device failure(s) or data corruption(s)) of storage array 120. For these examples, in addition to the four parity storage devices depicted in FIG. 1, storage array also includes four data storage devices. As shown in FIGS. 3A-D, parities associated with the four data storage devices are shown as column headers 122-1 to 122-4 and parities associated with the four parity storage devices are shown as column headers 123-126.

According to some examples, as described above, the storage devices of storage array 120 may be divided into $(p-1)^2$ chunks, where p is a prime number greater than 3. So for the example storage array mentioned above for FIGS. 3A-D, p=5. Thus, for these examples, the storage devices of storage array 120 may be divided into $(5-1)^2=16$ chunks. As a result of being divided into 16 chunks, each of the parity tables shown in FIGS. 3A-D includes 16 rows.

In some examples, the triple parity encoding scheme shown in FIGS. 3A-D may be based, at least in part, on implementing one or more example equations or algorithms as shown below. The example equations may be based, at least in part, on the following assumptions for each of the data storage devices 122-1 to 122-4:

p is a prime number greater than 3,
data storage devices are represented as D,
D(k,j) and (k=0, 1, ... p−2) and (j=0, 1, ..., $(p-1)^2-1$),
where j is the $j^{th}$ chunk on data storage device k.

The example equations may also be based, at least in part, on the following assumptions for each of the parity storage devices 123-126:

p is a prime number greater than 3,
parity storage devices are represented as DP,
DP(i,j) and (i=1, 2, 3, 4) and (j=0, 1, ..., $(p-1)^2-1$),
where j is the $j^{th}$ chunk on parity storage device i.

In some examples, first row parities spanning data storage devices 122-1 to 122-4 may be determined according to example equation (1). For these examples, the first row parities are identified in the far right column of table 310 of FIG. 3A and may be stored in row parity storage device 123.

$$DP(1, j) = \bigoplus_{k=0}^{p-2} D(k, j) \quad (1)$$

In some examples, first diagonal parities along first diagonal parity sets may be determined according to example equation (2). As described more below, the first diagonal parities may span all except for one of data storage devices 122-1 to 122-4 and row parity storage device 123. For these examples, the first diagonal parities are identified in the far right column of table 320 of FIG. 3B and may be stored in diagonal parity storage device 124.

$$\text{If}(j \% (p-1) == (p-2)) DP(2, j) = \bigoplus_{k=0}^{j\%(p-1)} D(k, j-k) \oplus \bigoplus_{k=j\%(p-1)+2}^{p-2} D(k, j+p-k) \quad (2)$$

$$\text{Else } DP(2, j) = \bigoplus_{k=0}^{j\%(p-1)} D(k, j-k) \oplus \bigoplus_{k=j\%(p-1)+2}^{p-2} D(k, j+p-k) \oplus DP(1, j+1)$$

According to some examples, as shown in table 320, the first diagonal parities along the first diagonal parity sets may be defined based, at least in part, on the first diagonal parity sets wrapping around within $(p-1)^2$ rows so that all chunks belonging to a respective first diagonal parity set of a given stripe are stored in the given stripe. For example, the first diagonal parity set identified as "0" in the far right column of table 320 includes chunks from data storage device 122-1 at row 1, data storage device 122-3 at row 4, data storage device 122-4 at row 3 and row parity storage device 123 at row 2. Also, note that the first diagonal parity set identified as "0" spans all except for one of data storage devices 122-1 to 122-4 and row parity storage device 123. The one storage device excepted is data storage device 122-2. Further, note that other first diagonal parity sets also span all except for one of data storage devices 122-1 to 122-4 and row parity storage device 123.

In some examples, second diagonal parities along second diagonal parity sets may be determined according to example equation (3). As described more below, the second diagonal parities may span all except for one of data storage devices 122-1 to 122-4 and row parity storage device 123. For these examples, the second diagonal parities are identified in the far right column of table 330 of FIG. 3C and may be stored in diagonal parity storage device 125.

$$\text{If } (j/(p-1) == (p-2)) DP(3, j) = \bigoplus_{k=0}^{j\%(p-1)} D(k, j-k(p-1)) \oplus \bigoplus_{k=j\%(p-1)+2}^{p-2} D(k, j+(p-k)(p-1)) \quad (3)$$

$$\text{Else}$$

$$DP(3, j) = \bigoplus_{k=0}^{j\%(p-1)} D(k, j-k(p-1)) \oplus \bigoplus_{k=j\%(p-1)+2}^{p-2}$$

$$D(k, j+(p-k)(p-1) \oplus DP(1, (j+1)(p-1)), \text{ therefor.}$$

According to some examples, as shown in table 330, the second diagonal parities along the second diagonal parity sets may be defined based, at least in part, on the second diagonal parity sets wrapping around within $(p-1)^2$ rows so that all chunks belonging to a respective second diagonal parity set of a given stripe are stored in the given stripe. Also, similar to what was described above for table 320, the second diagonal parity sets span all except one of data storage devices 122-1 to 122-4 and row parity storage device 123.

In some examples, second row parities spanning data storage devices 122-1 to 122-4 may be determined according to example equation (4). For these examples, the second row parities are identified in the far right column of table 340 of FIG. 3D and may be stored in row parity storage device 126.

If $(j \% (p-1) + 1 > j/(p-1) + 1) DP(4, j) =$ (4)

$$\bigoplus_{k=0}^{j\%(p-1)} D(k, j - k(p-1) - k)) \oplus \bigoplus_{k=j\%(p-1)+2}^{j\%(p-1)} $$

$$D(k, j + p - k - k(p-1)) \oplus DP(1, (j+1)(p-1)) \oplus$$

$$\bigoplus_{k=j\%(p-1)+2}^{p-2} D(k, j + p - (p-k)(p-1))$$

Else $DP(4, j) = \bigoplus_{k=0}^{j\%(p-1)} D(k, j - k(p-1) - k)) \oplus$ $$\bigoplus_{k=j\%(p-1)+2}^{j\%(p-1)} D(k, j - k - (p-k)(p-1)) \oplus$$

$$\bigoplus_{k=j\%(p-1)+2}^{p-2} D(k, j + p - (p-k)(p-1))$$

According to some examples, as shown in table 340, the second row parities may span data storage devices 122-1 to 122-4. Also, for these examples, at least some of the determined second row parities may be based on a portion of the data storage devices rather than all four of the data storage devices. For example, a row parity at row 2 of table 340 indicates a determined row parity based on three of the four data storage devices and a row parity at row 12 indicates a determined row parity based on two of the four data storage devices.

According to some examples, recovery manager 117 may include logic and/or features configured to recover from various different types of failures associated with storage array 120 (e.g., via recovery feature 218). For example, if three data storage devices fail, recovery manager 117 may implement a first row-diagonal parity (RDP) scheme that may utilize one or more row parity values associated with the second row parities stored in row parity storage device 126 and one or more diagonal parity values associated with the second diagonal parities stored in diagonal parity storage device 125. Recovery manager 117 may also implement a second RDP scheme that utilizes one or more diagonal parity values associated with the first diagonal parities stored in diagonal parity storage device 124 and one or more row parity values associated with the first row parities stored in row parity storage device 123. For these examples, by implementing the first and second RDP schemes, the data maintained in the three failed storage devices may be recovered.

In some examples, a combination of data storage devices and parity storage devices may fail or have data corruption. For example, one of the data storage devices and both row parity storage device 123 and diagonal parity storage device 124 may fail or have a data corruption. Recovery manager 117 may implement a single RDP scheme that utilizes one or more diagonal parity values associated with the first diagonal parities stored in diagonal parity storage device 124 and one or more one or more row parity values associated with the second row parities stored in row parity storage device 126. For these examples, as a result of implementing the single RDP scheme, the data maintained in the failed data storage devices may be recovered as well as the parity values stored in row parity storage device 123 and diagonal parity storage device 124.

The example failures described above are just two examples of how recovery manager 117 may implement one or more RDP schemes to recover data or parity values stored in failed or data corrupted storage devices of storage array 120. Various other RDP schemes may be implemented by using row and diagonal parity values stored in row parity storage devices 123, 126 or diagonal parity storage devices 124, 125 to recover data or parity values.

Figure 4:
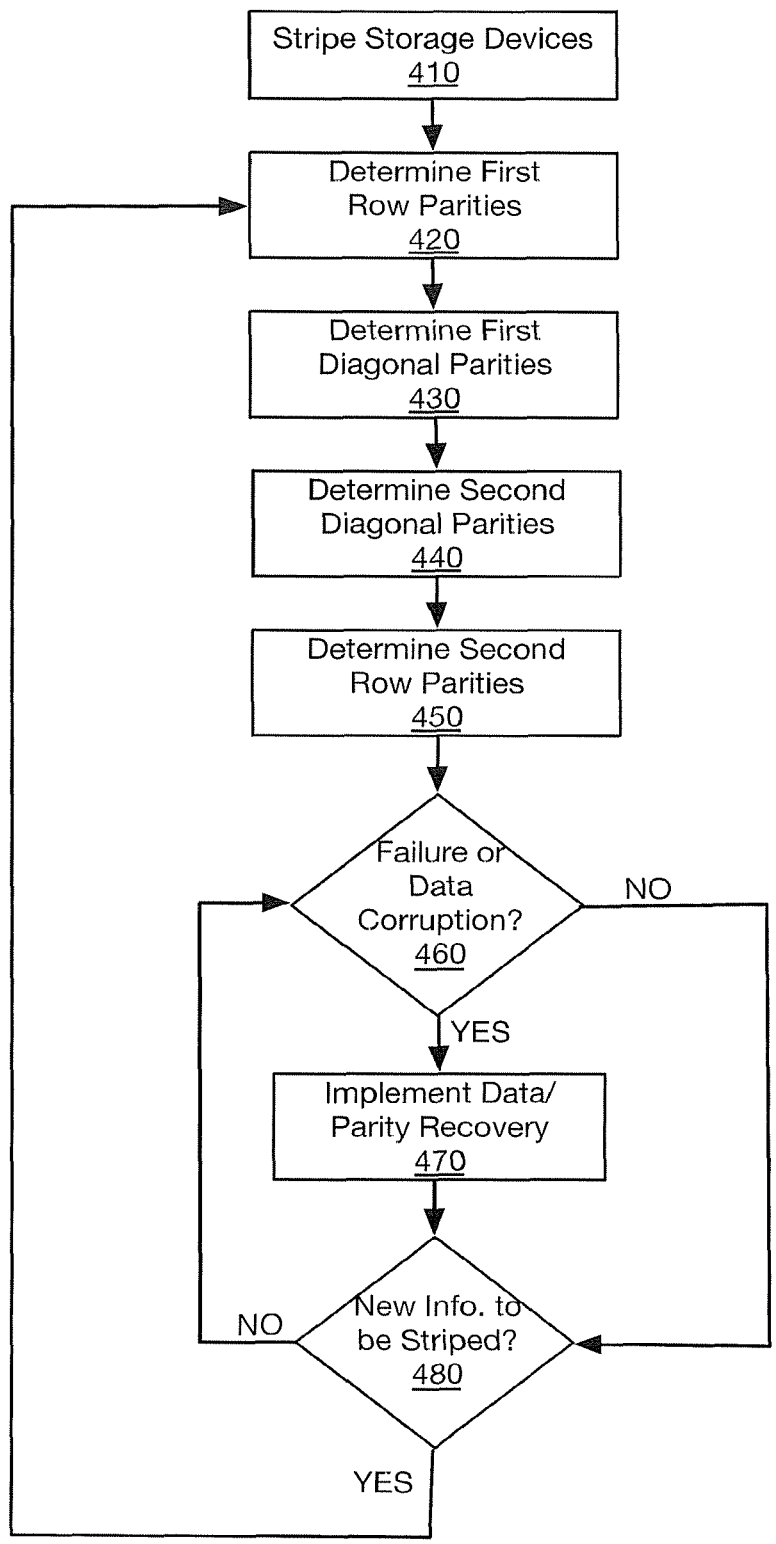
FIG. 4 illustrates a flow chart of example methods for facilitating recovery from failures associated with a storage array.

FIG. 4 illustrates a flow chart of example methods for facilitating recovery from failures associated with a storage array. In some examples, system 100 as shown in FIG. 1, is used to illustrate example methods related to the flow chart depicted in FIG. 4. A recovery manager 117 as shown in FIG. 2 may also be used to illustrate the example methods. But the described methods are not limited to implementations as shown in or described for FIG. 1 or 2. The example methods may be implemented on other systems or managers having one or more of the elements depicted in FIG. 1 or 2.

Beginning at block 410 (Stripe Storage Devices), recovery manager 117 may include logic and/or features configured to stripe the storage devices of storage array 120 (e.g., via stripe feature 212). In some examples, the storage devices may be divided into chunks and then organized into stripes that include a same number of chunks in each storage device. As described previously, the storage devices of storage array 120 may be divided into $(p-1)^2$ and with a value of 5 for p this equates to $(5-1)^2$ or 16 chunks.

Continuing from block 410 to block 420 (Determine First Row Parities), recovery manager 117 may include logic and/or features configured to determine first row parities (e.g., via row feature 214). In some examples, row feature 214 may implement example equation (1) to determine the first row parities. For these examples, the first row parities may be stored in row parity storage device 123.

Continuing from block 420 to block 430 (Determine First Diagonal Parities), recovery manager 117 may include logic and/or features configured to determine first diagonal parities (e.g., via diagonal feature 216). In some examples, diagonal feature 214 may implement example equation (2) to determine the first diagonal parities. For these examples, the first diagonal parities may be stored in diagonal parity storage device 124.

Continuing from block 430 to block 440 (Determine Second Diagonal Parities), recovery manager 117 may include logic and/or features configured to determine second diagonal parities (e.g., via diagonal feature 216). In some examples, diagonal feature 216 may implement example equation (3) to determine the second diagonal parities. For these examples, the second diagonal parities may be stored in diagonal parity storage device 125.

Continuing from block 440 to block 450 (Determine Second Row Parities), recovery manager 117 may include logic and/or features configured to determine second row parities (e.g., via row feature 214). In some examples, row feature 214 may implement example equation (4) to determine the second row parities. For these examples, the second row parities may be stored in row parity storage device 126.

Continuing from block 450 to decision block 460 (Failure or Data Corruption), recovery manager 117 may include logic and/or features configured to determine whether failures or data corruption has occurred on one or more of the storage devices of storage array 120 (e.g., via recovery feature 218). If failure or data corruption has occurred, the process moves to block 470. Otherwise, the process moves to block 480.

Moving from decision block 460 to block 470 (Implement Data/Parity Recovery), recovery manager 117 may include logic and/or features configured to implement one or more recovery schemes (e.g., via recovery feature 218). In some examples, the one or more recovery schemes may include RDP schemes to recover data or parity information lost from device failures and/or data corruption associated with the storage devices of storage array 120.

Continuing from block 470 to decision block 480 (New Info. to be Striped?), recovery manager 117 may include logic and/or features configured to determine whether new information or data needs to be striped on the storage devices of storage array 120 (e.g., via stripe feature 212). If new information or data is to be striped, the process moves to block 420 and row/diagonal parities may be determined. Otherwise the process moves to decision block 460.

FIG. 5 illustrates a block diagram of an example computer program product 500. In some examples, as shown in FIG. 5, computer program product 500 includes a signal bearing medium 502 that may also include instructions 504 to facilitate recovery from failures associated with a storage array (e.g., storage array 120). The storage array may have a plurality of storage devices that includes a plurality of data storage devices, a first row parity storage device, a second row parity storage device, a first diagonal parity storage device and a second diagonal parity storage device. Instructions 504, which, when executed by logic (e.g., recover logic 210), may cause the logic to determine first row parities for the plurality of data storage devices. The first row parities may span the plurality of data storage devices and may be stored on the first row parity storage device. Instructions 504 may also cause the logic to determine first diagonal parities along first diagonal parity sets. The first diagonal parities may span all except for one of the plurality of data storage devices and the first row parity storage device and may be stored on the first diagonal parity storage device. Instructions 504 may also cause the logic to determine second diagonal parities along second diagonal parity sets. The second diagonal parities may span all except for one of the plurality of data storage devices and the first row parity storage device and may be stored on the second diagonal parity storage device. Instructions 504 may also cause the logic to determine second row parities for the plurality of data storage devices. The second row parities may span the plurality of data storage devices and may be stored on the second row parity storage device. In some examples, at least a portion of one or more rows of the second row parities may include a determined second row parity based on a portion of the plurality of data storage devices.

Also depicted in FIG. 5, in some examples, computer product 500 may include one or more of a computer readable medium 506, a recordable medium 508 and a communications medium 510. The dotted boxes around these elements depict different types of mediums included within, but not limited to, signal bearing medium 502. These types of mediums may distribute instructions 504 to be executed by logic (e.g., recover logic 210). Computer readable medium 506 and recordable medium 508 may include, but are not limited to, a flexible disk, a hard disk drive (HDD), a Compact Disc (CD), a Digital Versatile Disk (DVD), a digital tape, a computer memory, etc. Communications medium 510 may include, but is not limited to, a digital and/or an analog communication medium (e.g., a fiber optic cable, a waveguide, a wired communication link, a wireless communication link, etc.).

Figure 6:
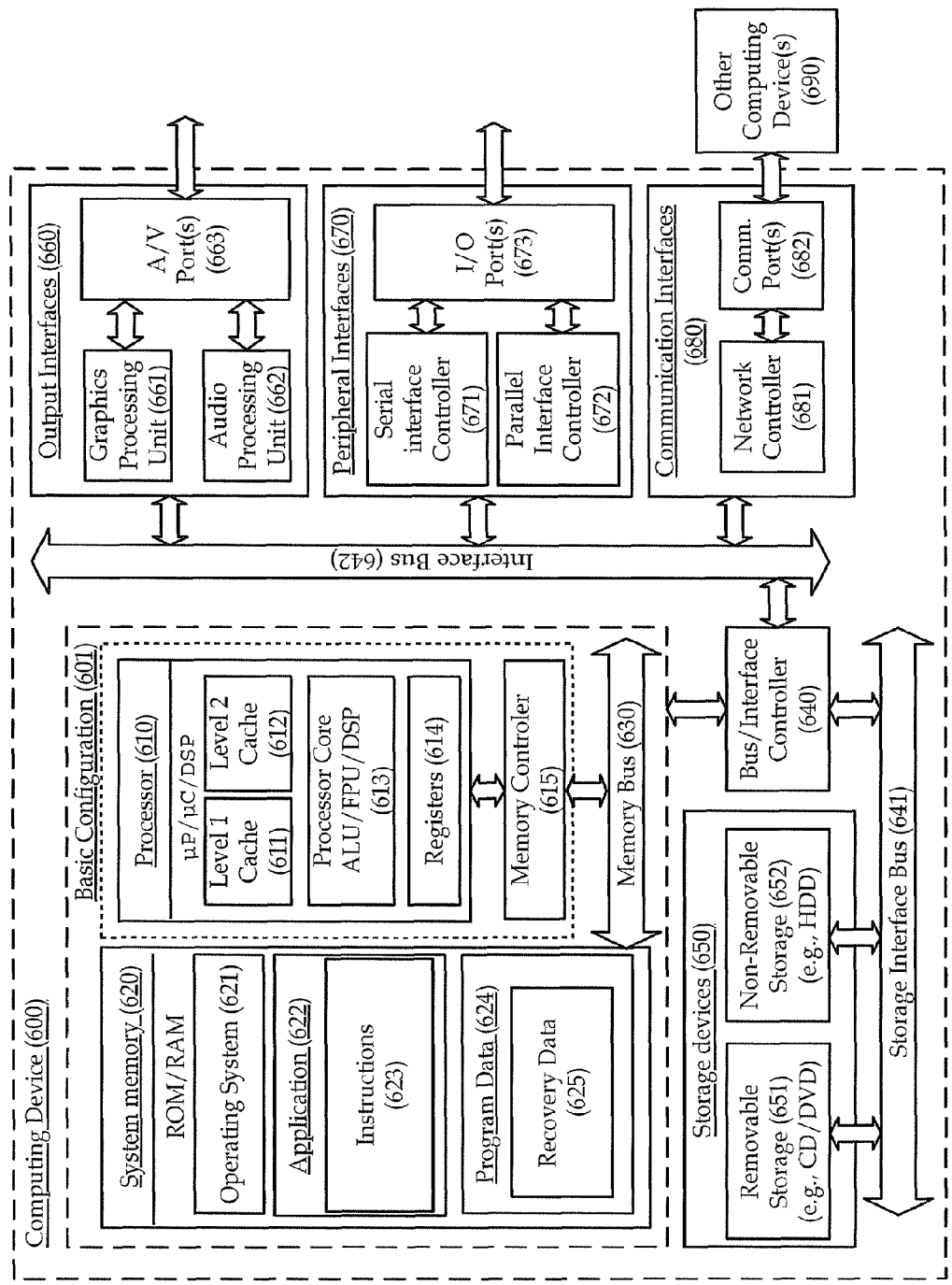
FIG. 6 illustrates an example computing device, all arranged in accordance with at least some embodiments of the present disclosure.

FIG. 6 illustrates an example computing device 600. In some examples, recovery manager 117 depicted in FIGS. 1-2 may be implemented on computing device 600. In these examples, elements of computing device 600 may be arranged or configured for allocating a block of persistent storage or for a file system or application to access a block of persistent storage. In a very basic configuration 601, computing device 600 typically includes one or more processors 610 and system memory 620. A memory bus 630 can be used for communicating between the processor 610 and the system memory 620.

Depending on the desired configuration, processor 610 can be of any type including but not limited to a microprocessor ($\mu$P), a microcontroller ($\mu$C), a digital signal processor (DSP), or any combination thereof. Processor 610 can include one or more levels of caching, such as a level one cache 611 and a level two cache 612, a processor core 613, and registers 614. The processor core 613 can include an arithmetic logic unit (ALU), a floating point unit (FPU), a digital signal processing core (DSP Core), or any combination thereof. A memory controller 615 can also be used with the processor 610, or in some implementations the memory controller 615 can be an internal part of the processor 610.

Depending on the desired configuration, the system memory 620 can be of any type including but not limited to volatile memory (such as RAM), non-volatile memory (such as ROM, flash memory, etc.) or any combination thereof. System memory 620 typically includes an operating system 621, one or more applications 622, and program data 624. Application 622 includes instructions 623 that are arranged to perform the functions as described herein including the actions described with respect to the recovery manager 117 architecture shown in FIG. 2. Program Data 624 includes recovery data 625 that is useful for implementing instructions 623 (e.g., determining row/diagonal parities). In some examples, application 622 can be arranged to operate with program data 624 on an operating system 621 such that implementations for facilitating recovery from failures associated with a storage array may be provided as described herein. This described basic configuration is illustrated in FIG. 6 by those components within dashed line 601.

Computing device 600 can have additional features or functionality, and additional interfaces to facilitate communications between the basic configuration 601 and any required devices and interfaces. For example, a bus/interface controller 640 can be used to facilitate communications between the basic configuration 601 and one or more data storage devices 650 via a storage interface bus 641. The data storage devices 650 can be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 620, removable storage 651 and non-removable storage 652 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 600. Any such computer storage media can be part of device 600.

Computing device 600 can also include an interface bus 642 for facilitating communication from various interface devices (e.g., output interfaces, peripheral interfaces, and communication interfaces) to the basic configuration 601 via the bus/interface controller 640. Example output interfaces 660 include a graphics processing unit 661 and an audio processing unit 662, which can be configured to communicate to various external devices such as a display or speakers via one or more A/V ports 663. Example peripheral interfaces 670 include a serial interface controller 671 or a parallel interface controller 672, which can be configured to communicate with external devices such as input devices (e.g., keyboard, mouse, pen, voice input device, touch input device, etc.) or other peripheral devices (e.g., printer, scanner, etc.) via one or more I/O ports 673. An example communication interface 680 includes a network controller 681, which can be arranged to facilitate communications with one or more other computing devices 690 over a network communication via one or more communication ports 682. A network communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 600 can be implemented as a portion of a small-form factor portable (or mobile) electronic device such as a cell phone, smart phone, a personal data assistant (PDA), a personal media player device, a wireless web-watch device, a personal headset device, an application specific device, or a hybrid device that include any of the above functions. Computing device 600 can also be implemented as a personal computer including both laptop computer and non-laptop computer configurations or implemented in a workstation or a server configuration.

References made in this disclosure to the term "responsive to" or "in response to" are not limited to responsiveness to a particular feature and/or structure. A feature may also be responsive to another feature and/or structure and also be located within that feature and/or structure. Moreover, when terms or phrases such as "coupled" or "responsive" or "in response to" or "in communication with", etc. are used herein or in the claims that follow, these terms should be interpreted broadly. For example, the phrase "coupled to" may refer to being communicatively, electrically and/or operatively coupled as appropriate for the context in which the phrase is used.

Those skilled in the art will recognize that it is common within the art to describe devices and/or processes in the fashion set forth herein, and thereafter use engineering practices to integrate such described devices (e.g., transmitters, receivers, wireless devices, computing platforms, computing devices, etc.) and/or methods into data processing systems. That is, at least a portion of the devices and/or methods described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available component, such as those typically found in data computing/communication and/or network computing/communication systems.

The herein described subject matter sometimes illustrates different components or elements contained within, or connected with, different other components or elements. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the aterms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

The invention claimed is:

1. A method to facilitate data recovery of a storage array, comprising:
   organizing a plurality of storage devices into stripes according to a striping scheme;
   determining first and second row parities and first and second diagonal parities according to the striping scheme;
   implementing a first row-diagonal parity (RDP) scheme that utilizes one or more row parity values associated with the first row parities and one or more diagonal parity values associated with the first diagonal parities; and
   implementing a second RDP scheme that utilizes one or more diagonal parity values associated with the second diagonal parities and one or more row parity values associated with the second row parities.

2. The method of claim 1, wherein the plurality of storage devices includes n data storage devices, wherein n=p−1 and p includes a prime number greater than 3.

3. The method of claim 2, further comprising:
   dividing each of the plurality of storage devices into chunks; and
   wherein the striping scheme includes organizing a same number of chunks in each of the plurality of storage devices, wherein each of the plurality of storage devices are striped into $(p-1)^2$ chunks.

4. The method of claim 3, wherein the determining the first row parities and the second row parities according to the striping scheme includes the first row parities and the second row parities being separately defined based, at least in part, on determined first row parities and determined second row parities that separately include $(p-1)^2$ rows.

5. The method of claim 4, wherein the determining the first diagonal parities along the first diagonal parity sets include the first diagonal parities being defined based, at least in part, on the first diagonal parity sets wrapping around within $(p-1)^2$ rows, wherein the chunks belonging to a respective first diagonal parity set of a given stripe are stored in the given stripe.

6. The method of claim 5, wherein the determining the second diagonal parities along the second diagonal parity sets include the second diagonal parities being defined based, at least in part, on the second diagonal parity sets partially wrapping around within the $(p-1)^2$ rows, wherein the chunks belonging to a respective second diagonal parity set of a given stripe are stored in the given stripe.

7. The method of claim 3, wherein each of the plurality of storage devices are striped according to a Redundant Array of Independent Disks (RAID) scheme.

8. The method of claim 1, wherein the plurality of storage devices includes at least one of a hard disk drive, a solid state disk drive, a direct access storage device, magnetic tape, bubble memory, optical storage media, electronic random access or a digital versatile disk.

9. The method of claim 1, wherein failures associated with the data recovery include a combination of failures in one or more of the plurality of storage devices or checksum errors associated with the one or more of the plurality of storage devices.

10. An apparatus, comprising:
    a recovery manager configured to:
    organize a plurality of storage devices into stripes according to a striping scheme;
    determine first and second row parities and first and second diagonal parities according to the striping scheme;
    implement a first row-diagonal parity (RDP) scheme that utilizes one or more row parity values associated with the first row parities and one or more diagonal parity values associated with the first diagonal parities; and
    implement a second RDP scheme that utilizes one or more diagonal parity values associated with the second diagonal parities and one or more row parity values associated with the second row parities.

11. The apparatus of claim 10, wherein the plurality of storage devices includes n data storage devices, wherein n=p−1 and p is a prime number greater than 3.

12. The apparatus of claim 10, wherein the recovery manager is further configured to:
    divide each of the plurality of storage devices into chunks; and
    wherein the striping scheme includes organizing a same number of chunks in each of the plurality of storage devices, wherein each of the plurality of storage devices are striped into $(p-1)^2$ chunks.

13. The apparatus of claim 12, wherein the determining the first row parities and the second row parities according to the striping scheme includes the first row parities and the second row parities being separately defined based, at least in part, on determined first row parities and determined second row parities that separately include $(p-1)^2$ rows.

14. The apparatus of claim 13, wherein the determining the first diagonal parities along the first diagonal parity sets include the first diagonal parities being defined based, at least in part, on the first diagonal parity sets wrapping around within $(p-1)^2$ rows, wherein the chunks belonging to a respective first diagonal parity set of a given stripe are stored in the given stripe.

15. The apparatus of claim 14, wherein the determining the second diagonal parities along the second diagonal parity sets include the second diagonal parities being defined based, at least in part, on the second diagonal parity sets partially wrapping around within the $(p-1)^2$ rows, wherein the chunks belonging to a respective second diagonal parity set of a given stripe are stored in the given stripe.

16. The apparatus of claim 12, wherein each of the plurality of storage devices are striped according to a Redundant Array of Independent Disks (RAID) scheme.

17. The apparatus of claim 10, wherein the plurality of storage devices includes at least one of a hard disk drive, a solid state disk drive, a direct access storage device, magnetic tape, bubble memory, optical storage media, electronic random access or a digital versatile disk.

18. The apparatus of claim 10, wherein failures associated with the data recovery include a combination of failures in one or more of the plurality of storage devices or checksum errors associated with the one or more of the plurality of storage devices.

19. A system to facilitate data recovery of a storage array, comprising:
   a plurality of data storage devices, a first row parity storage device, a second row parity storage device, a first diagonal parity storage device and a second diagonal parity storage device; and
   a recovery manager configured to:
      organize the plurality of storage devices into stripes according to a striping scheme;
      determine first and second row parities and first and second diagonal parities according to the striping scheme;
      implement a first row-diagonal parity (RDP) scheme that utilizes one or more row parity values associated with the first row parities and one or more diagonal parity values associated with the first diagonal parities; and
      implement a second RDP scheme that utilizes one or more diagonal parity values associated with the second diagonal parities and one or more row parity values associated with the second row parities.

20. The system of claim 19,
   wherein the determining the first row parities and the second row parities according to the striping scheme includes the first row parities and the second row parities being separately defined based, at least in part, on determined first row parities and determined second row parities that separately include $(p-1)^2$ rows; and
   wherein the determining the first diagonal parities along the first diagonal parity sets include the first diagonal parities being defined based, at least in part, on the first diagonal parity sets wrapping around within $(p-1)^2$ rows, wherein the chunks belonging to a respective first diagonal parity set of a given stripe are stored in the given stripe.

* * * * *